United States Patent
Kagomiya et al.

[11] Patent Number: 5,872,474
[45] Date of Patent: Feb. 16, 1999

[54] WAVEFORM SHAPING CIRCUIT

[75] Inventors: Shigetoshi Kagomiya; Toshihiko Kawata, both of Miyagi-ken, Japan

[73] Assignee: Alps Electric Co., Ltd., Tokyo, Japan

[21] Appl. No.: 893,108

[22] Filed: Jul. 15, 1997

[30] Foreign Application Priority Data

Jul. 25, 1996 [JP] Japan .................................... 8-196490

[51] Int. Cl.⁶ .................................................... H03K 4/96
[52] U.S. Cl. ............................ 327/130; 327/170; 327/478
[58] Field of Search .................................. 327/130, 134, 327/108, 170, 172, 173, 174, 175, 427, 434, 478

[56] References Cited

U.S. PATENT DOCUMENTS

| | | | |
|---|---|---|---|
| 3,275,851 | 9/1966 | Bedingfield | 327/130 |
| 3,573,502 | 4/1971 | Kan | 327/170 |
| 3,597,638 | 8/1971 | Jensen | 327/130 |
| 4,504,779 | 3/1985 | Haman | 327/170 |

*Primary Examiner*—Timothy P. Callahan
*Assistant Examiner*—Jung Ho Kim
*Attorney, Agent, or Firm*—Brinks Hofer Gilson & Lione

[57] ABSTRACT

An object of the present invention is to provide a waveform shaping circuit for producing a trapezoidal pulse whose leading edge and trailing edge have the same slope and not inducing and radiating harmonic components under any conditions. A waveform shaping circuit comprises a common-emitter transistor 1, a first resistor 2 and second resistor 3 connected in series between a signal input terminal 9 and the base of the transistor 1, a third resistor and first capacitor 5 connected in parallel between a node a between the first resistor 2 and second resistor 2 and a ground, a feedback capacitor 6 connected between the collector of the transistor 1 and the node 1, and a collector load resistor 7 connected in series with the collector of the transistor 1. The waveform of a pulse to be applied to the signal input terminal 9 is reshaped to produce a trapezoidal pulse whose leading edge and trailing edge have a substantially equal slope, and then the trapezoidal pulse is led through a signal output terminal 10. When the waveform shaping circuit is employed in a transmission unit in a communication block in a door control unit included in an on-vehicle multiplex communication network system, the magnitude of induction and radiation of unwanted harmonic components can be reduced drastically.

5 Claims, 5 Drawing Sheets

WAVEFORM SHAPING CIRCUIT

BACKGROUND OF THE INVENTION

1. Field of the Invention

The present invention relates to a waveform shaping circuit for alleviating the sharpness of the leading and trailing edges of an input pulse, thus reshaping the waveform of the input pulse so as to produce a trapezoidal pulse, and outputting the trapezoidal pulse. More particularly, this invention is concerned with a waveform shaping circuit preferable for employment in an on-vehicle multiplex communication network system.

2. Description of the Related Art

In general, for a local area network (LAN), a binary pulse (rectangular pulse) representing two levels is used as a communication signal to be transmitted over a bus line. Such a pulse (rectangular pulse) has a waveform exhibiting a sharp rise and fall, and contains many harmonic components in addition to a baseband frequency component. When the pulse is transmitted over the bus line, the induced and radiated harmonic components may adversely affect the operations of electrical equipment located nearby. If the electrical equipment located nearby includes a radio set, the induced and radiated harmonic components are mixed in and superposed on a signal received by the radio set, and thus interferes with a receiving operation of the radio set.

An on-vehicle multiplex communication network system that has been adopted widely for vehicles or the like these days is no exception to the fact that the induced and radiated harmonic components adversely affect nearby electrical equipment. When a signal propagating over a bus line is a pulse (rectangular pulse), harmonic components of the pulse whose frequencies are included in a baseband adversely affect the operations of on-vehicle electrical equipment, for example, a radio set, a television set, and a car navigation system.

For eliminating the adverse effect of the harmonic components of a pulse (rectangular pulse), as far as a multiplex communication network system, or especially, a on-vehicle multiplex communication network system is concerned, a pulse (rectangular pulse) exhibiting sharp rise and fall characteristics is not transmitted over a bus line, but the waveform of the pulse (rectangular pulse) is reshaped to produce a trapezoidal pulse exhibiting moderate fall and rise characteristics, and the trapezoidal pulse is transmitted over the bus line. Thus, the magnitude of induction and radiation of harmonic components occurring when the trapezoidal pulse is transmitted over the bus line is reduced.

For such a multiplex communication network system, several circuits have already been proposed as a waveform shaping circuit for reshaping the waveform of a pulse (rectangular pulse) so as to produce a trapezoidal pulse.

FIG. 5 is a circuit diagram showing an example of the circuitry of a known waveform shaping circuit. FIGS. 6A and 6B are signal waveform diagrams showing examples of input and output signals of the waveform shaping circuit shown in FIG. 5, FIG. 6A shows the waveform of an input pulse, and FIG. 6B shows the waveform of an output trapezoidal pulse.

As shown in FIG. 5, the waveform shaping circuit comprises a common-emitter transistor 51, a first resistor 53 and second resistor 54 connected in series between a signal input terminal 52 and the base of the transistor 51, a feedback capacitor 55 connected between the collector of the transistor 51 and a node a between the first resistor 53 and second resistor 54, a collector load resistor 57 connected between the collector of the transistor 51 and a power supply terminal 56, and an output resistor 59 connected between the collector of the transistor 51 and a signal output terminal 58.

The operations of the above circuit performed when a negative pulse (rectangular pulse) shown in FIG. 6A is applied to the signal input terminal 52 will be described below.

To begin with, when the pulse remains high, the transistor 51 is fully on. The potential at the signal output terminal 58 is therefore low. The feedback capacitor 55 has an electrode thereof on the side of the node a charged positively and has another electrode thereof charged negatively on the side of the collector of the transistor 51.

Thereafter, the pulse makes a high-to-low transition, and then remains low. This causes a current to flow from the power supply terminal 56 through the collector resistor 57, feedback capacitor 55, and first resistor 53 to the signal input terminal 52. With the current, the polarities of charges in the feedback capacitor 55 are reversed successively. At the same time, the base voltage of the transistor 51 falls gradually. The transistor 51 changes from the fully-on state through an intermediately-on stage to a fully-off state. With the change of the conducting state, the potential at the signal output terminal 58 rises slopingly so as to make a low-to-high transition, and then remains high. In this case, the sloping rise time of the potential at the signal output terminal 58 is set to an RC constant determined with a sum of resistance values of the collector resistor 57 and first resistor 53 as well as the capacitance value of the feedback capacitor 55.

Thereafter, the pulse makes a low-to-high transition and then remains high. With the high-level pulse applied to the node a through the first resistor 53 and a current flowing through a closed loop composed of the feedback capacitor 55, the collector-base passage of the transistor 51, and the second resistor 54, the polarities of the charges on the feedback capacitor 55 are reversed successively. At the same time, the base voltage of the transistor 51 rises duly. The transistor 51 changes from the fully-off state through the intermediately-on state to the fully-on state. With the change of the conducting state, the potential at the signal output terminal 58 falls slopingly so as to make a high-to-low transition, and then goes back to the initial state in which the potential remains low. In this case, the sloping fall time of the potential at the signal output terminal 58 is set to an RC constant determined with the resistance values of the first resistor 53 and second resistor 54 as well as the capacitance value of the feedback capacitor 55.

As mentioned above, the known waveform shaping circuit responds to a pulse (rectangular pulse), shown in FIG. 6A, which is applied to the signal input terminal 52. A trapezoidal pulse having sloping leading and trailing edges as shown in FIG. 6B is output through the signal output terminal 58.

The foregoing known waveform shaping circuit has the merit of low manufacturing cost because the circuit has relatively simple circuitry and consists of general-purpose circuit elements.

However, in the known waveform shaping circuit, as shown in the signal waveform diagram of FIG. 6B, the slope of the rise of a resultant trapezoidal pulse is different from the slope of the fall thereof. In particular, the slope of the fall of the trapezoidal pulse is relatively sharp. When the waveform shaping circuit is employed in an on-vehicle multiplex communication network system, the bandwidth of an output trapezoidal pulse changes due to a relatively severe voltage fluctuation occurring in an on-vehicle power supply. Depending on the changed state, the trapezoidal pulse induces and radiates harmonic components when propagating over the bus line.

Thus, the known waveform shaping circuit has a problem that assuming that the known waveform shaping circuit is employed in an on-vehicle multiplex communication network system, when a trapezoidal pulse is transmitted over a bus line, the trapezoidal pulse induces and radiates harmonic components under certain conditions.

SUMMARY OF THE INVENTION

The present invention attempts to solve the above problem. An object of the present invention is to provide a waveform shaping circuit for producing an output trapezoidal pulse whose leading edge and trailing edge have a moderate slope and which induces and radiates very little harmonic components.

For accomplishing the object, the waveform shaping circuit of the present invention comprises a first resistor and second resistor connected in series between a signal input terminal and the base of a transistor, a third resistor and first capacitor connected in parallel between a node a between the first resistor and second resistor and a ground, and a feedback capacitor connected between the collector of the transistor and the node a. The waveform shaping circuit further comprises a means for reshaping the waveform of a pulse (rectangular pulse) applied to the signal input terminal so as to produce a trapezoidal pulse whose leading edge and trailing edge have substantially the same slope, and then leading out the trapezoidal pulse from the collector of the transistor.

Using the means, the leading edge and trailing edge of the resultant trapezoidal pulse have substantially the same slope. Even when a severe fluctuation occurs in supply voltage, the bandwidths of the leading edge and trailing edge can be confined to a relatively narrow range. When the trapezoidal pulse is transmitted over a bus line in an on-vehicle multiplex communication network system, the extent of induction and radiation of harmonic components in and from the bus line is minimized.

According to an aspect of the present invention, a waveform shaping circuit comprises: a transistor having at least a first main electrode, a second main electrode, and a control electrode, and having the first main electrode grounded; first and second resistors connected in series between a signal input terminal and the control electrode; a third resistor and first capacitor connected in parallel between a node a between the first and second resistors and a ground; a second capacitor connected between the second main electrode and node a; and a load resistor connected between the second main electrode and a power supply terminal. The waveform of a pulse applied to the signal input terminal is reshaped to produce a trapezoidal pulse whose leading edge and trailing edge have substantially the same slope. The resultant trapezoidal pulse pulse is then led through the second main electrode.

According to another aspect of the present invention, the transistor is a junction transistor. The first main electrode, second main electrode, and control electrode are the emitter, collector, and base of the junction transistor. Alternatively, the transistor may be a field-effect transistor. In this case, the first main electrode, second main electrode, and control electrode are the source, drain, and gate of the field-effect transistor.

According to another aspect of the present invention, a preferred embodiment is such that the pulse is a pulse command output from a control unit in a door control unit included in an on-vehicle multiplex communication network system, the trapezoidal pulse is a trapezoidal-wave command to be placed on a bus line in the on-vehicle multiplex communication network system, and the waveform shaping circuit serves as a major circuit in a transmission unit in a communication block.

According to another aspect of the present invention, the first to third resistors, first capacitor, and feedback capacitor are coupled with the transistor in the waveform shaping circuit. By specifying the resistance values and capacitor values appropriately, the trapezoidal pulse resulting from reshaping of the waveform of an input pulse (rectangular pulse) is shaped so that the leading edge and trailing edge thereof have substantially the same slope. Even if the waveform shaping circuit undergoes a severe fluctuation in supply voltage, the bandwidths of the leading edge and trailing edge can be confined to a relatively narrow range.

Even when the shaped trapezoidal pulse is transmitted over the bus line in the on-vehicle multiplex communication network system, since the bandwidths of the leading edge and trailing edge of the trapezoidal pulse can be confined to the relatively narrow range, the extent of induction and radiation of harmonic components in and from the bus line can be minimized more effectively than that in a known waveform shaping circuit.

DESCRIPTION OF THE PREFERRED EMBODIMENTS

An embodiment of the present invention will be explained in detail using the drawings below.

Figure 1:
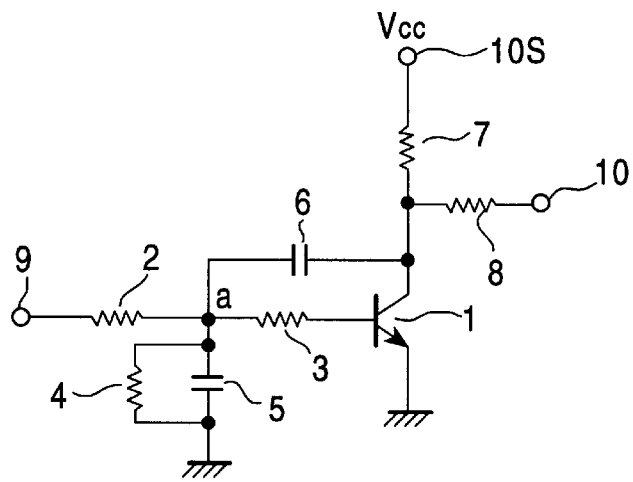
FIG. 1 is a block diagram showing the circuitry of an embodiment of a waveform shaping circuit in accordance with the present invention.

FIG. 1 is a block diagram showing the circuitry of an embodiment of a waveform shaping circuit in accordance with the present invention.

As shown in FIG. 1, the waveform shaping circuit of this embodiment comprises a common-emitter npn transistor 1, a first resistor 2 and second resistor 3 connected in series between a signal input terminal 9 and the base of the transistor 1, a third resistor 4 and first capacitor 5 connected in parallel between a node a between the first resistor 2 and second resistor 3 and a ground, a feedback capacitor 6 connected between the collector of the transistor 1 and the node a, a collector load resistor 7 connected between the collector of the transistor 1 and a power supply terminal 10S, and an output resistor 8 connected between the collector thereof and a signal output terminal 10.

Figure 2A:
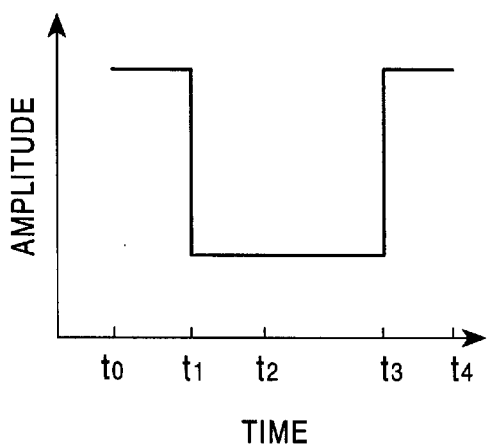
FIGS. 2A and 2B are signal waveform diagrams showing examples of input and output signals of the waveform shaping circuit shown in FIG. 1.
Figure 2B:
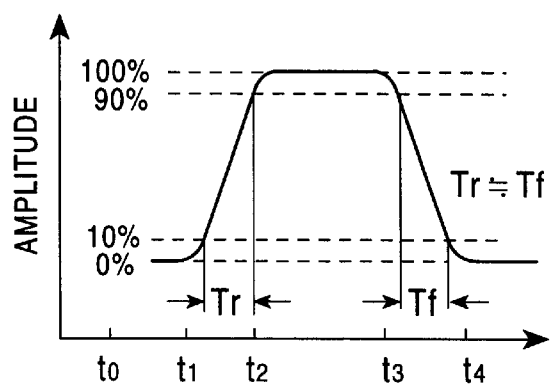

FIGS. 2A and 2B are signal waveform diagrams showing examples of input and output signals of the waveform shaping circuit shown in FIG. 1. FIG. 2A is a signal waveform diagram showing a pulse (rectangular pulse) serving as an input signal, and FIG. 2B is a signal waveform diagram showing a trapezoidal pulse serving as an output signal.

In FIGS. 2A and 2B, the axis of ordinates indicates amplitudes, and the axis of abscissae indicates time.

The operations of the waveform shaping circuit shown in FIG. 1 will be described in conjunction with the signal waveform diagrams of FIGS. 2A and 2B.

To begin with, during a first period between time instants t0 and t1, a pulse to be applied to the signal input terminal 9 is substantially as high as a supply voltage $V_{CC}$ applied to the power supply terminal 10S. A voltage that is as high as the pulse is applied to the base of the transistor 1 via the first resistor 2 and second resistor 3. This brings the transistor 1 to a fully-on state. A low-level voltage substantially equivalent to a ground potential is led through the signal output terminal 9. At this time, the feedback capacitor 6 has a positive charge accumulated at an electrode thereof on the side of the node a and has a negative charge accumulated at the other electrode on the side of the collector.

At a time instant t1, the pulse to be applied to the signal input terminal 9 makes a high-to-low transition so as to become substantially equivalent to the ground potential. In response to the high-to-low transition, a low-level voltage is applied to the base of the transistor 1 via the first resistor 2 and second resistor 3. At this time, because of the positive charge accumulated at the node aside electrode of the feedback capacitor 6, the base voltage of the transistor 1 does not go low to become substantially equivalent to the ground potential but remains high. The transistor 1 is retained in the on state. A voltage that is substantially as low as the ground potential is led through the signal output terminal 10.

During a second period between the time instant t1 and a time instant 2, the pulse to be applied to the signal input terminal 9 is low. Immediately after the pulse is driven low, a current flows into the signal input terminal 9 through the collector load resistor 7, feedback capacitor 6, and first resistor 2 in proportion to the supply voltage $V_{CC}$ at the power supply terminal 10S. At the same time, a current flows from the node a through the third resistor 4 and first capacitor 5 to the ground. The polarities of the charges on the feedback capacitor 6 are reversed so that the positive charge is changed to a negative charge. Accordingly, the base of the transistor 1 makes a high-to-low transition. The transistor 1 changes from a fully-on state through an intermediately-on state to a fully-off state. At this time, a voltage that makes a state transition according to the conducting state of the transistor 1, that is, rises slopingly so as to make a low-to-high transition is led through the signal output terminal 10. The slope (rise time) Tr of the leading edge of the voltage led through the signal output terminal 10 is set to a time constant determined with the resistance value of the collector load resistor 7, the resistance values of the first resistor 2 and third resistor 4, and the capacitance values of the feedback capacitor 6 and first capacitor 5.

During a third period between the time instant t2 and a time instant t3, the pulse to be applied to the signal input terminal 9 is driven low. A voltage that is as low as the pulse is applied to the base of the transistor I via the first resistor 2 and second resistor 3. This brings the transistor 1 to the fully-off state. A voltage that is substantially as high as the supply voltage $V_{CC}$ is therefore led through the signal output terminal 10. At this time, the feedback capacitor 6 has a negative charge accumulated at the node a-side electrode thereof and has a positive charge accumulated at the collector-side electrode thereof.

At the time instant t3, the pulse to be applied to the signal input terminal 9 makes a low-to-high transition. With the low-to-high transition, a high-level voltage is applied to the base of the transistor 1 via the first resistor 2 and second resistor 3. At this time, because of the negative charge at the node a-side electrode of the feedback capacitor 6, the base voltage of the transistor 1 does not go high to become substantially equivalent to the supply voltage $V_{CC}$ but remains low. The transistor 1 is therefore retained in the off state. A high-level voltage substantially equivalent to the supply voltage $V_{CC}$ is led through the signal output terminal 10.

During a fourth period between the time instant t3 and a time instant t4, the pulse to be applied to the signal input terminal 9 is high. Immediately after the pulse is driven high, a current flows through a closed loop composed of the feedback capacitor 6, the base-collector passage of the transistor 1, and the second resistor 3. Part of the current flows into the first capacitor 5. The polarities of charges on the feedback capacitor 6 are reversed so that the negative charge at the node a-side electrode thereof becomes a positive charge. Accordingly, the base voltage of the transistor 1 makes a low-to-high transition. The transistor 1 changes from the fully-off state through the intermediately-on state to the fully-on state. At this time, a voltage that makes a state transition according to the conducting state of the transistor 1, that is, falls slopingly so as to make a high-to-low transition is led through the signal output terminal 10. The slope (fall time) Tf of the trailing edge of the voltage led through the signal output terminal 10 is set to a time constant determined with the resistance value of the second resistor 3, the instantaneous resistance value of the base-collector passage of the transistor 1, and the capacitance values of the feedback capacitor 6 and first capacitor 5.

During a fifth period succeeding the time instant t4, the pulse to be applied to the input terminal 7 is high. A voltage that is as high as the pulse is applied to the base of the transistor 1 via the first and second resistors 2 and 3. This brings the transistor 1 to the fully-on state. A low-level voltage is still led through the output terminal 10.

Thereafter, the operations allocated to the first to fifth periods are repeatedly executed.

As mentioned above, since the waveform shaping circuit of this embodiment is composed of a relatively small number of circuit elements, that is, the transistor 1, first resistor 2, second resistor 3, third resistor 4, collector load resistor 7, first capacitor 5, and feedback capacitor 6, the circuitry is simple. Since inexpensive general-purpose circuit elements alone such as the transistor 1, resistors 2 to 4 and 7, and capacitors 5 and 6 are used, the manufacturing cost is low.

In the waveform shaping circuit of this embodiment, by appropriately specifying the resistance values of the first resistor 2, second resistor 3, third resistor 4, and collector load resistor 7, and the capacitance values of the first capacitor 5 and feedback capacitor 6, the slopes of the leading edge and trailing edge of a trapezoidal pulse led through the signal output terminal 10 can be substantially equalized with each other. The bandwidths of the leading edge and trailing edge can be confined to a relatively narrow range compared with that in a known waveform shaping circuit.

Assuming that the waveform shaping circuit of this embodiment is, as mentioned below, employed in a motorcar body control network system, when a trapezoidal pulse is transmitted over the bus line, since the bandwidths of the leading edge and trailing edge of the trapezoidal pulse can be confined to a relatively narrow range, the magnitude of induction and radiation of harmonic components in and from the bus line can be minimized compared with that when the known waveform shaping circuit is employed.

This embodiment has been described by taking the junction npn transistor 1 for instance. The present invention is not limited to the circuitry including the junction npn transistor 1. Alternatively, a junction pnp transistor may be employed and a field-effect transistor (FET) may be employed.

Another embodiment may be such that a reverse current prevention zener diode is connected between the collector load resistor 7 and power supply terminal 10S, and a diode is connected between a node between the collector load resistor 7 and zener diode and the signal output terminal 10, and between the signal output terminal 10 and ground.

Figure 3:
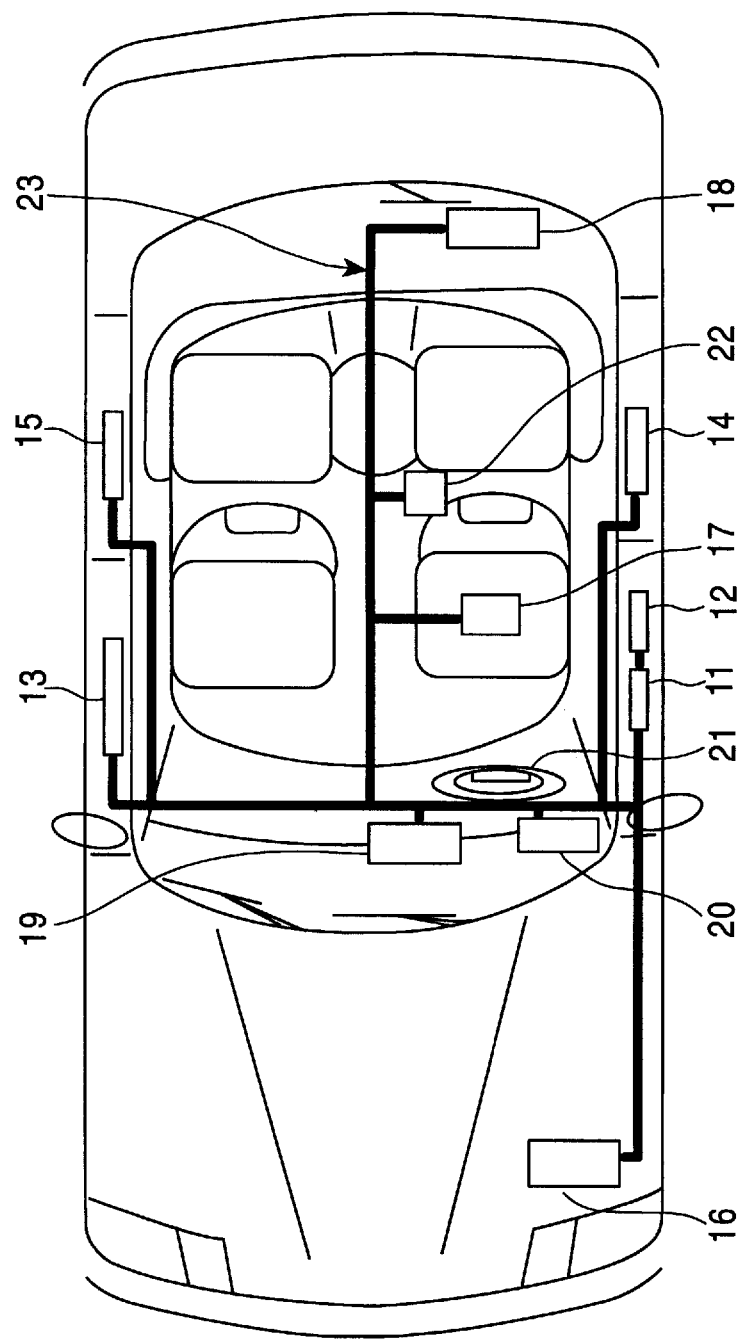
FIG. 3 is a schematic diagram showing an example of a motorcar body control network system (on-vehicle multiplex communication network system) in which the waveform shaping circuit shown in FIG. 1 is employed.

FIG. 3 is a schematic diagram showing an example of a motorcar body control network system (on-vehicle multiplex communication network system) in which the waveform shaping circuit of the present invention is employed.

As shown in FIG. 3, a door control unit 11 and driver's seat-side door control unit 12 are located near a driver's seat in a motorcar body, an assistant's seat-side door control unit 13 is located near an assistant's seat therein, a back left-hand door control unit 14 is located near a back left-hand seat therein, and a back right-hand door control unit 15 is located near a back right-hand seat therein. A front control unit 16 is located in a bonnet of the motorcar body, a seat control unit 17 is located near the driver's seat, and a back control unit 18 is located in a luggage boot. An instrument panel control unit 19 and steering column control unit 20 are located near a front panel, a steering switch 21 is located near a steering wheel, and a sunroof control unit 22 is located near a roof. Furthermore, a bus line 23 on which the units 11 to 20 and 22 are interconnected is laid down inside the motorcar body.

Among the foregoing components, the assistant's seat-side door control unit 13, back left-hand door control unit 14, and back right-hand door control unit 15 each have a control unit (CPU) and communication block. Herein, when a window open/close switch used to open or close the window of an assistant's seat-side door or a lock switch used to lock or unlock the assistant's seat-side door is handled, the assistant's seat-side door control unit 13 drives an actuator connected to the control unit 13 so as to open or close the window or lock or unlock the door. When a window open/close switch used to open or close the window of the back left-hand door or a lock switch used to lock or unlock the door is handled, the back left-hand door control unit 14 drives the actuator connected to the control unit 13 so as to open or close the window or lock or unlock the door. When a window open/close switch used to open or close the window of the back right-hand door or a lock switch used to lock or unlock the door is handled, the back right-hand door control unit 15 drives the actuator connected to the control unit 13 so as to open or close the window or lock or unlock the door. The driver's seat-side door control unit 12 includes a control unit (CPU) and communication block, is connected to an actuator used to open or close the window of the driver's seat and to an actuator used to lock or unlock the door, but has no switch.

In response to a request sent from the door control unit 11 that will be described later, the assistant's seat-side door control unit 13, back left-hand door control unit 14, or back right-hand door control unit 15 uses a sensor, which is connected thereto, to independently sense the open or closed state of the associated door according to the predetermined rules, and then transmits the result of the sensing to the door control unit 11.

The door control unit 11 includes a window open/close switch used to open or close the window of the driver's seat-side door, a window open/close switch used to open or close the windows of the doors other than the driver's seat-side door, and a lock switch for locking or unlocking all the doors. According to which of the switches is handled, the door control unit 11 transmits a command to any of the three control units of the assistant's seat-side door control unit 13, back left-hand door control unit 14, and back right-hand door control unit 15, and allows any of the three control units 13, 14, and 15 having received the command to control an operation instructed with the command. The door control unit 11 thus has the ability to transmit a command to the three control units 13, 14, and 15, the ability to monitor the open or closed states of the doors and the locked states of the doors, and the ability to receive commands or sensed signals indicating the states from the three control units 13, 14, and 15 and transmit a command to the three control units 13, 14, and 15.

The door control unit 11 is connected to a receiver for receiving a communication signal sent from a transmitter of a keyless entry system, uses an external input signal processing block thereof to check the communication signal received by the receiver, transmits a command to the driver's seat-side door control unit 12, assistant's seat-side door control unit 13, back left-hand door control unit 14, and back right-hand door control unit 15, and, if necessary, transmits a command to the control units 16 to 22 other than the door control units 12 to 15. For example, assuming that a received communication signal indicates a request for opening a door, when a command is sent to the seat control unit 17, processing such as processing of moving the seats to pre-programmed positions is carried out.

The front control unit 16 changes the angle of projection of a light (head lamp) and controls a light washer, a forward obstacle sensor, and the like. The seat control unit 17 controls the positions of the motor-driven seats. The back control unit 18 opens or closes the boot and controls a back sonar (backward obstacle sensor) or the like. The instrument panel control unit 19 senses if any of the switches arranged on a dash board is handled, transmits a command to a control unit relevant to the handling, receives the state of any control unit, and indicates the state using a meter on the dash board. The steering column control unit 20 transmits the handled state of the steering switch 21, an output of a rudder sensor for the steering wheel, or the like as a command to a control unit relevant to the handling.

Figure 4A:
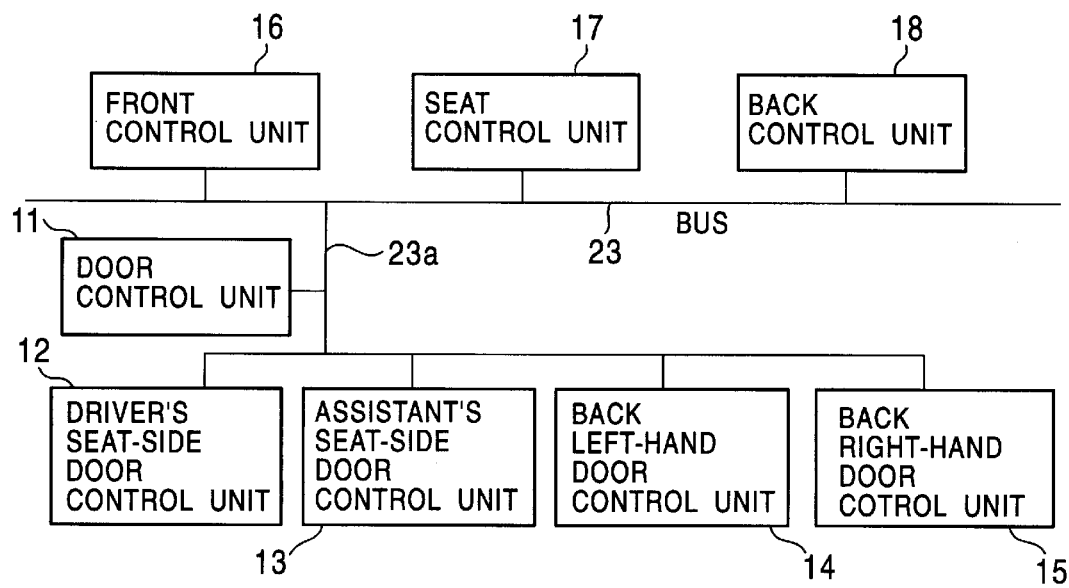
FIGS. 4A and 4B are diagrams showing the detailed configuration of the motorcar body control network system shown in FIG. 3.
Figure 4B:
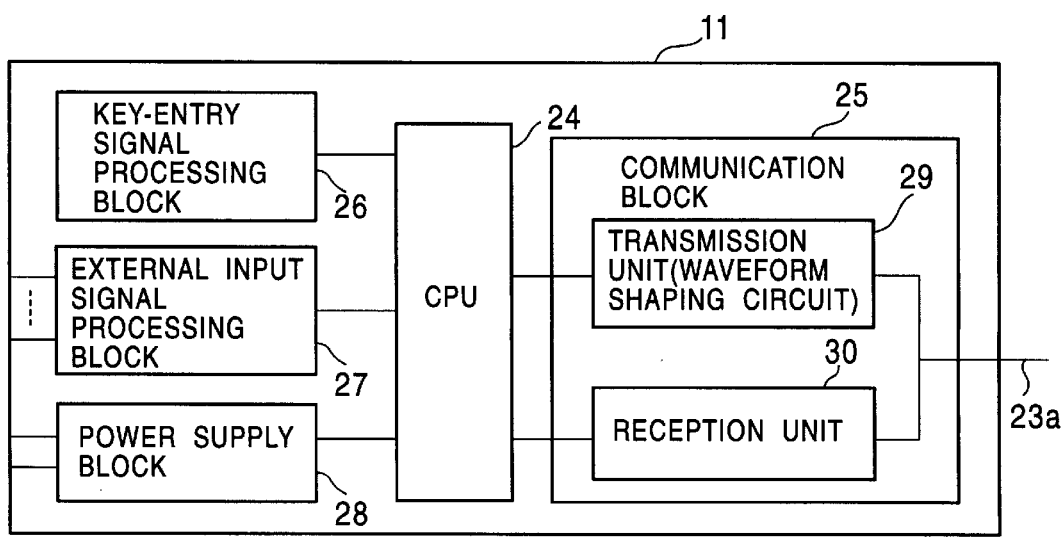
Figure 5:
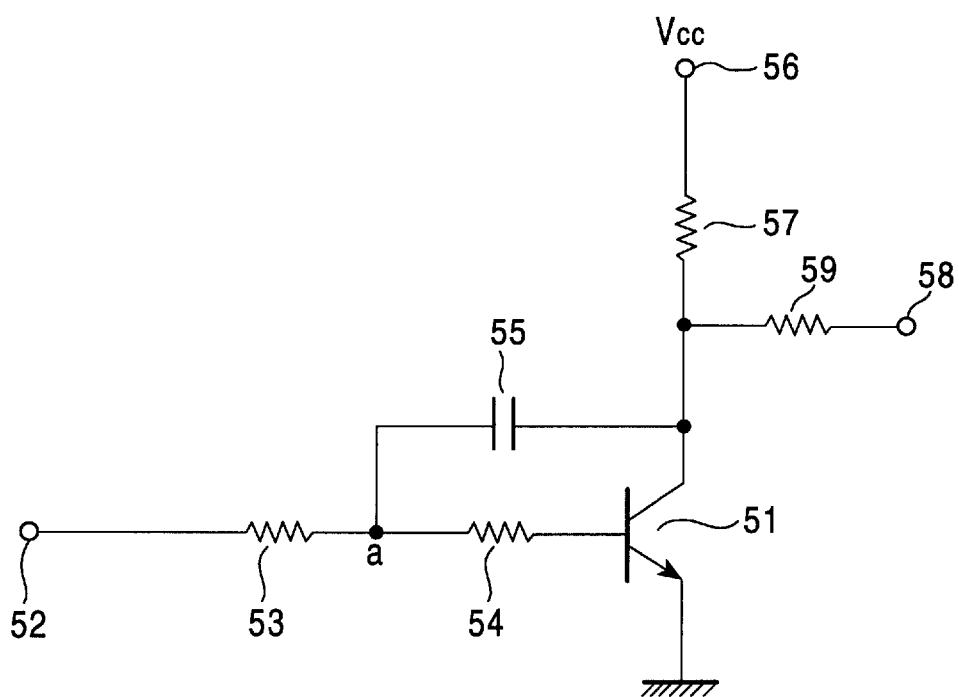
FIG. 5 is a circuit diagram showing an example of the circuitry of a known waveform shaping circuit.
Figure 6A:
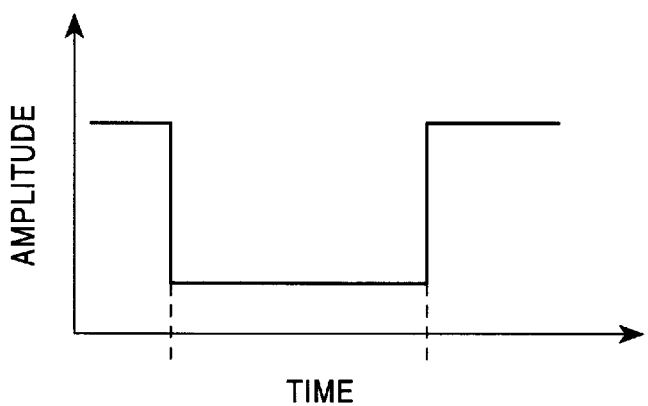
FIGS. 6A and 6B are signal waveform diagrams showing examples of input and output signals of the waveform shaping circuit shown in FIG. 5.
Figure 6B:
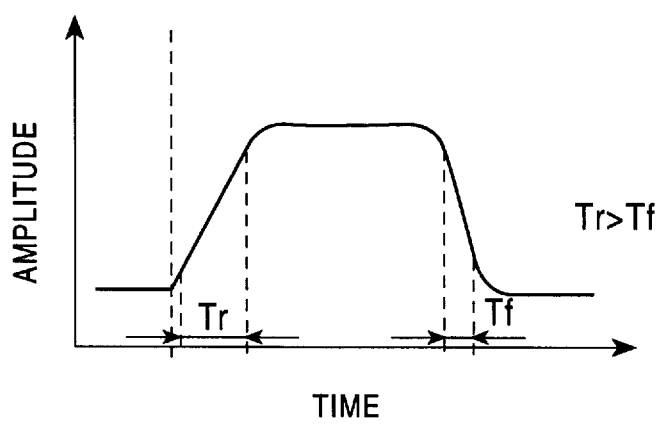

FIGS. 4A and 4B are diagrams showing the detailed configuration of the motorcar body control network system shown in FIG. 3. FIG. 4A is a connection diagram showing the relationship of connection between the major control blocks and bus line, and FIG. 4B is a block diagram showing the internal configuration of the door control unit.

As shown in FIG. 4A, an output terminal of the door control unit 11 is connected on an auxiliary bus line 23a. The driver's seat-side door control unit 12, assistant's seat-side door control unit 13, back left-hand door control unit 14, and back right-hand door control unit 15 are interconnected in common on the auxiliary bus line 23a. The auxiliary bus line 23a is coupled with the bus line 23. The front control unit 16, seat control unit 17, and back control unit 18 are interconnected on the bus line 23.

Owing to the interconnection on the auxiliary bus line 23a, the aforesaid operations are executed between the door control unit 11, and the driver's seat-side door control unit 12, assistant's seat-side door control unit 13, back left-hand door control unit 14, and back right-hand door control unit 15. Likewise, owing to the interconnection on the bus line 23, the aforesaid operations are executed between the door control unit 11, and the front control unit 16, seat control unit 17, and back control unit 18.

As shown in FIG. 4B, the door control unit 11 consists of a control unit (CPU) 24, communication block 25, key-entry signal processing block 26, external input signal processing block 27, and power supply block 28. The communication block 25 includes a transmission unit 29 employing the waveform shaping circuit of the present invention and a reception unit 30. In the communication block 25, the transmission unit 29 has an input terminal thereof connected to the control unit 24 and an output terminal thereof connected on the auxiliary bus line 23a. The reception unit 30 has an input terminal thereof connected on the auxiliary bus line 23a and an output terminal thereof connected to the control unit 24. The key-entry signal processing block 26 has an output terminal thereof connected to the control unit 24. The external input signal processing block 27 has an input terminal thereof connected to a receiver or the like for receiving a communication signal sent from a transmitter in a keyless entry system, and an output terminal thereof connected to the control unit 24. The power supply block 28 has an input terminal thereof connected to an external power supply unit and an output terminal thereof connected to the control unit 24.

In the foregoing configuration, the control unit 24 controls the operations of the whole door control unit 11 in cooperation with the control units (CPUs) included in the other control units. In the communication block 25, the transmission unit 29 reshapes the waveform of a pulse command (rectangular-wave command) output from the control unit so as to produce a trapezoidal-wave command, and routes the trapezoidal-wave command along the auxiliary bus line 23a. Waveform shaping of the present invention is implemented in the operation of reshaping the waveform of a pulse command so as to produce a trapezoidal-wave command. The reception unit 30 applies the trapezoidal pulse routed along the auxiliary bus line 23a to the control unit 24 as it is, or applies the trapezoidal pulse after reshaping the waveform of the trapezoidal pulse so as to produce a pulse. The key-entry signal processing block 26 specifies a handled switch among all the window open/close switches used to open or close the windows of all the doors including the the driver's seat-side door located by the side of the driver's seat, and the lock switches for locking or unlocking the doors. The external input signal processing block 27 checks a communication signal supplied from the receiver for receiving a communication signal sent from the transmitter in the keyless entry system. Only when a normal communication signal is received, the communication signal is supplied to the control unit 24. The power supply block 28 supplies operating power from the external power supply unit to the control unit 24.

When the waveform shaping circuit of the present invention, which has relatively simple circuitry, requires low manufacturing cost, and generates a trapezoidal pulse whose leading edge and trailing edge have a substantially equal slope, is employed in the transmission unit in the communication block in the door control unit included in the motorcar body control network system (on-vehicle multiplex communication network system), the magnitude of induction and radiation of unwanted harmonic components in the on-vehicle multiplex communication network system can be reduced unprecedentedly drastically without the necessity of designing a complex configuration for the on-vehicle multiplex communication network system.

As described so far, according to the first to third aspects of the present invention, a waveform shaping circuit comprises one transistor, four resistors of a first resistor, second resistor, third resistor, and load resistor, and two capacitors of a first capacitor and feedback capacitor. The circuitry is therefore relatively simple. Moreover, the circuitry consists of inexpensive general-purpose circuit elements such as a transistor, resistors, diodes, and capacitors. This exerts the effect of low manufacturing cost. Beside, by appropriately specifying the resistance values of the first resistor, second resistor, third resistor, and load resistor and the capacitance values of the first capacitor and feedback capacitor, the slopes of the leading edge and trailing edge of a produced trapezoidal pulse can be equalized with each other. This exerts an effect that the bandwidths of the leading edge and trailing edge can be confined to a relatively narrow range compared with those in a known waveform shaping circuit.

According to the fourth aspect of the present invention, when a waveform shaping circuit is employed in a transmission unit in a communication block in a door control unit included in an on-vehicle multiplex communication network system, since the bandwidths of the leading edge and trailing edge of a trapezoidal pulse can be confined to a relatively narrow range, the magnitude of induction and radiation of unwanted harmonic components in the on-vehicle multiplex communication network system can be reduced drastically compared with that in a known waveform shaping circuit.

What is claimed is:

1. A waveform shaping circuit, comprising:
   a transistor having at least a first main electrode, second main electrode, and control electrode, and having said first main electrode grounded;
   first and second resistors connected in series between a signal input terminal and said control electrode;
   a third resistor and first capacitor connected in parallel between a node between said first and second resistors and a ground;
   a second capacitor connected between said second main electrode and said node; and
   a load resistor connected between said second main electrode and power supply terminal,
   wherein the waveform of a pulse to be applied to said signal input terminal is reshaped to produce a trapezoidal pulse whose leading edge and trailing edge have a substantially equal slope, and then the trapezoidal pulse is led through said second main electrode.

2. A waveform shaping circuit according to claim 1, wherein said transistor is a junction transistor, and said first main electrode, second main electrode, and control electrode are the emitter, collector, and base of the junction transistor.

3. A waveform shaping circuit according to claim 1, wherein said transistor is a field-effect transistor, and said first main electrode, second main electrode, and control electrode are the source, drain, and gate of the field-effect transistor.

4. A waveform shaping circuit according to claim 1, wherein said pulse is a pulse command output from a control unit in a door control unit included in an on-vehicle multiplex communication network system, said trapezoidal pulse is a trapezoidal-wave command to be placed on a bus line in the network system, and said waveform shaping circuit is a major circuit in a transmission unit in a communication block.

5. A waveform shaping circuit according to claim 2, wherein said pulse is a pulse command output from a control unit in a door control unit included in an on-vehicle multiplex communication network system, said trapezoidal pulse is a trapezoidal-wave command to be placed on a bus line in the network system, and said waveform shaping circuit is a major circuit in a transmission unit in a communication block.

* * * * *